United States Patent
Hu et al.

(10) Patent No.: US 12,300,604 B2
(45) Date of Patent: May 13, 2025

(54) DISPLAY PANEL AND DISPLAY TERMINAL

(71) Applicant: TCL CHINA STAR OPTOELECTRONICS TECHNOLOGY CO., LTD., Shenzhen (CN)

(72) Inventors: Chunxiao Hu, Shenzhen (CN); Yoonsung Um, Shenzhen (CN); Xiaojin He, Shenzhen (CN); Qi Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/792,355

(22) PCT Filed: Jun. 21, 2022

(86) PCT No.: PCT/CN2022/100108
§ 371 (c)(1),
(2) Date: Jul. 12, 2022

(87) PCT Pub. No.: WO2023/226120
PCT Pub. Date: Nov. 30, 2023

(65) Prior Publication Data
US 2024/0178135 A1    May 30, 2024

(30) Foreign Application Priority Data
May 25, 2022 (CN) .......................... 202210577903.0

(51) Int. Cl.
*H01L 23/528* (2006.01)
(52) U.S. Cl.
CPC ................................ *H01L 23/528* (2013.01)

(58) Field of Classification Search
CPC .......... H01L 23/528; G09G 2300/0426; G09G 2310/021; G09G 2320/0209;
(Continued)

(56) References Cited

U.S. PATENT DOCUMENTS

| | | | |
|---|---|---|---|
| 2011/0242140 A1* | 10/2011 | Lee | G09G 3/3648 345/89 |
| 2012/0026206 A1* | 2/2012 | Moon | G09G 3/3614 257/59 |

(Continued)

FOREIGN PATENT DOCUMENTS

| | | | | |
|---|---|---|---|---|
| CN | 101285950 A | | 10/2008 | |
| CN | 105913813 | * | 3/2012 | ........... G09G 3/3614 |

(Continued)

OTHER PUBLICATIONS

PCT International Search Report for International Application No. PCT/CN2022/100108, mailed on Dec. 23, 2022, 10pp.

(Continued)

*Primary Examiner* — Galina G Yushina
(74) *Attorney, Agent, or Firm* — The Roy Gross Law Firm, LLC; Roy D. Gross

(57) ABSTRACT

Embodiments of the present disclosure are directed to a display panel and a display device. The display panel includes a pixel array and a plurality of data lines. The pixel array includes a plurality of sub-pixel groups arranged in array, and the sub-pixel groups of the same color are arranged along a first direction. The display terminal includes a terminal body and the display panel. By connecting the data line with the sub-pixel groups of the same color, the display panel as disclosed is capable of overcoming the problem of poor charging uniformity of two adjacent luminous sub-pixels when displaying a solid color picture due to (Continued)

the sub-pixels of different colors connected to the same data line in the traditional two-row dot inversion framework.

20 Claims, 3 Drawing Sheets

(58) Field of Classification Search
CPC ......... G09G 2320/0233; G09G 3/3614; G09G 2320/0295; G09G 2300/0439; G09F 9/30
See application file for complete search history.

(56) References Cited

U.S. PATENT DOCUMENTS

| | | | | |
|---|---|---|---|---|
| 2012/0113154 | A1* | 5/2012 | Ge | G09G 3/3614 345/88 |
| 2014/0125644 | A1* | 5/2014 | Guo | G09G 3/3648 345/88 |
| 2017/0249914 | A1 | 8/2017 | Kim et al. | |
| 2018/0151145 | A1* | 5/2018 | Lee | G09G 5/02 |
| 2018/0350317 | A1* | 12/2018 | Shin | G09G 3/3648 |
| 2019/0108781 | A1* | 4/2019 | Iwamoto | G09G 3/2003 |
| 2020/0118511 | A1* | 4/2020 | Chen | G09G 3/20 |

FOREIGN PATENT DOCUMENTS

| | | | | |
|---|---|---|---|---|
| CN | 103869565 | A | 6/2014 | |
| CN | 104090440 | A | 10/2014 | |
| CN | 106991953 | A | 7/2017 | |
| CN | 108269542 | A | 7/2018 | |
| CN | 110308599 | A | 10/2019 | |
| CN | 110456585 | A | 11/2019 | |
| CN | 112230484 | A | 1/2021 | |
| CN | 113552752 | A | 10/2021 | |
| CN | 113777839 | | * 10/2021 | ........... G09G 3/3614 |
| CN | 113777839 | A | 12/2021 | |

OTHER PUBLICATIONS

PCT Written Opinion of the International Search Authority for International Application No. PCT/CN2022/100108, mailed on Dec. 23, 2022, 7pp.

Chinese Office Action issued in corresponding Chinese Patent Application No. 202210577903.0 dated Dec. 13, 2022, pp. 1-7,18pp.

* cited by examiner

DISPLAY PANEL AND DISPLAY TERMINAL

This application is a National Phase of PCT Patent Application No. PCT/CN2022/100108 having International filing date of Jun. 21, 2022, which claims the benefit of priority of Chinese Patent Application No. 202210577903.0, filed May 25, 2022, the contents of which are all incorporated herein by reference in their entirety.

FIELD OF THE INVENTION

The present disclosure relates to the field of display technology, more particularly, to a display panel and a display terminal.

BACKGROUND

With the development of display technology, people have higher and higher requirements for the image quality of the display screen. In order to solve the problem of dynamic picture tailing of 4 K 60 Hz products, it is necessary to increase the refresh frequency of the panel from 60 Hz to 120 Hz. "Two-row scanning technology" is a method in which two rows of scanning lines are turned on at the same time. This technology is capable of realizing the transformation of a dynamic picture from 60 Hz to 120 Hz without increasing the cost. At present, there are mainly two types of display panels that can use the "two-row scanning technology": one type is the column inversion display panel, which adopts the driving mode of column inversion, with low power consumption and high charging rate of the display panel. However, its disadvantage is the risk of longitudinal crosstalk. The other type is the two-row dot inversion display panel, which adopts the driving mode of two-row dot inversion. This framework has a low risk of crosstalk. However, when the solid color picture is displayed, in a column of sub-pixels of a certain color, the charging rate of two adjacent sub-pixels connected to the same data line is different, resulting in the situation that one row is bright and the other row is dark. Macroscopically, it is an abnormal display problem of horizontal bright and dark lines.

Therefore, there is an urgent need for a display panel and a display terminal that can use the "two-row scanning technology" with low crosstalk risk and good charging uniformity in a solid color display.

SUMMARY

Technical Problem

The current display panel has a technical problem of uneven pixel charging rate when using the "two-row scanning technology" to display solid colors.

Technical Solution

An embodiment of the present disclosure is directed to a display panel. The display panel includes a pixel array and a plurality of data lines. The pixel array comprises a plurality of sub-pixel groups arranged in array. The sub-pixel groups of the same color are arranged along in a first direction, and each of the sub-pixel groups comprises at least two adjacent sub-pixels arranged along in the first direction. The plurality of data lines extend along the first direction and are arranged in the pixel array along a second direction. Polarities of adjacent data lines are opposite in the second direction perpendicular to the first direction. The sub-pixel groups of the same color are connected to the same data line, and the sub-pixel groups are alternately disposed on both sides of the data line in the sub-pixel groups of the same color connected to the same data line. At least one sub-pixel group is spaced between the sub-pixel groups connected to the data line and the data line in the second direction. A number of the data lines is greater than a number of the sub-pixel groups arranged along the second direction. At least one data line is disposed between two adjacent sub-pixel groups in the second direction.

Optionally, the pixel array comprises n columns of the sub-pixels in the second direction, a number of columns of the data lines is n+3, and n is a positive integer. Xth column of the sub-pixels is connected to (x−1)th column of the data lines or (x+2)th column of the data lines, 1≤x≤n, and x is a positive integer.

Optionally, the pixel array comprises m rows of the sub-pixels in the first direction, and m is a positive integer greater than or equal to 4; wherein ath row of the sub-pixels and (a−1)th of the sub-pixels are connected to (x+2)th column of the data lines in xth column of the sub-pixels.

Optionally, the pixel array comprises m rows of the sub-pixels in the first direction, and m is a positive integer greater than or equal to 4; wherein (4b−2)th row of the sub-pixels and (4b−3)th row of the sub-pixels are connected to (x−1)th column of the data lines in xth column of the sub-pixels, and b is a positive integer satisfying 4b−2≤m.

Optionally, the data lines comprise at least two first type of data lines located at a first side of the pixel array and at least two second type of data lines located at a second side of the pixel array in the second direction. In the second direction, the at least two first type of data lines are respectively connected to the first column of the sub-pixels and the second column of the sub-pixels, and the at least two second type of data lines are respectively connected to the last column of the sub-pixels and the second last column of the sub-pixels.

Optionally, the data lines further comprise a third type of data line located in the pixel array. An interval disposed between the two first type of data lines is less than an interval disposed between two third type of data lines in the second direction.

Optionally, an interval disposed between the two second type of data lines is less than an interval disposed between the two third type of data lines in the second direction.

Optionally, the display panel further comprises a plurality of connection lines connected to the data lines and the sub-pixels. The connection lines comprise a first type of connection line and a second type of connection line. The first type of connection line and the second type of connection line are alternately connected to the sub-pixel groups disposed on both sides of the data line in the first direction.

Optionally, a plurality of first type of connection lines are arranged in parallel with each other, and a plurality of second type of connection lines are arranged in parallel.

Optionally, an extension direction of the first type of connection lines and an extension direction of the second type of connection lines are different, and an included angle formed between the first type of connection lines and the data lines is the same as an included angle formed between the second type of connections lines and the data lines.

Another embodiment of the present disclosure is directed to a display panel. The display panel includes a pixel array and a plurality of data lines. The pixel array comprises a plurality of sub-pixel groups arranged in array. The sub-pixel groups of the same color are arranged along in a first direction, and each of the sub-pixel groups comprises at least two adjacent sub-pixels arranged along in the first direction. The plurality of data lines extend along the first direction and are arranged in the pixel array along a second direction. Polarities of adjacent data lines are opposite in the second direction perpendicular to the first direction. The sub-pixel groups of the same color are connected to the same data line, and the sub-pixel groups are alternately disposed on both sides of the data line in the sub-pixel groups of the same color connected to the same data line. At least one sub-pixel group is spaced between the sub-pixel groups connected to the data line and the data line in the second direction. At least one data line is disposed between two adjacent sub-pixel groups in the second direction.

Optionally, the pixel array comprises n columns of the sub-pixels in the second direction, a number of columns of the data lines is n+3, and n is a positive integer. Xth column of the sub-pixels is connected to (x−1)th column of the data lines or (x+2)th column of the data lines, 1≤x≤n, and x is a positive integer.

Optionally, the pixel array comprises m rows of the sub-pixels in the first direction, and m is a positive integer greater than or equal to 4; wherein ath row of the sub-pixels and (a−1)th of the sub-pixels are connected to (x+2)th column of the data lines in xth column of the sub-pixels.

Optionally, the pixel array comprises m rows of the sub-pixels in the first direction, and m is a positive integer greater than or equal to 4; wherein (4b−2)th row of the sub-pixels and (4b−3)th row of the sub-pixels are connected to (x−1)th column of the data lines in xth column of the sub-pixels, and b is a positive integer satisfying 4b-2≤m.

Optionally, the data lines comprise at least two first type of data lines located at a first side of the pixel array and at least two second type of data lines located at a second side of the pixel array in the second direction. In the second direction, the at least two first type of data lines are respectively connected to the first column of the sub-pixels and the second column of the sub-pixels, and the at least two second type of data lines are respectively connected to the last column of the sub-pixels and the second last column of the sub-pixels.

Optionally, the data lines further comprise a third type of data line located in the pixel array. An interval disposed between the two first type of data lines is less than an interval disposed between two third type of data lines in the second direction.

Optionally, an interval disposed between the two second type of data lines is less than an interval disposed between the two third type of data lines in the second direction.

Optionally, the display panel further comprises a plurality of connection lines connected to the data lines and the sub-pixels. The connection lines comprise a first type of connection line and a second type of connection line. The first type of connection line and the second type of connection line are alternately connected to the sub-pixel groups disposed on both sides of the data line in the first direction.

Optionally, a plurality of first type of connection lines are arranged in parallel with each other, and a plurality of second type of connection lines are arranged in parallel. An extension direction of the first type of connection lines and an extension direction of the second type of connection lines are different, and an included angle formed between the first type of connection lines and the data lines is the same as an included angle formed between the second type of connections lines and the data lines.

An embodiment of the present disclosure is also directed to a display terminal, which comprises a terminal body and a display panel mentioned above. The terminal body is integrated with the display panel.

Advantageous Effect

By connecting the data line with the sub-pixel groups of the same color, the present disclosure can overcome the problem of poor charging uniformity of two adjacent luminous sub-pixels when displaying a solid color picture due to the sub-pixels of different colors connected to the same data line in the traditional two-row dot inversion framework. In addition, the sub-pixel groups connected to the same data line are alternately disposed on both sides of the data line of the present disclosure, and at least one sub-pixel group is spaced between the data line and the sub-pixel groups connected to it, so that the problem of longitudinal crosstalk existing in the traditional column inversion display panel can be overcome. Furthermore, the present disclosure applies the "two-row scanning technology" to realize the transformation of a dynamic picture of the display panel from 60 Hz to 120 Hz.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely part of the embodiments of this application, and a person of ordinary skill in the art may still derive other drawings from these accompanying drawings without creative efforts.

DESCRIPTION OF THE EMBODIMENTS

Figure 1:
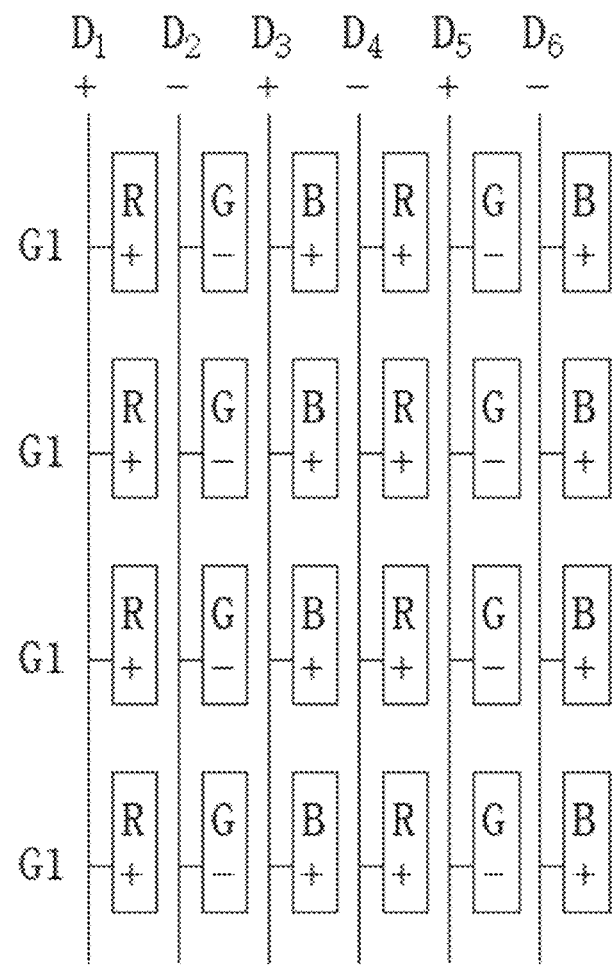
FIG. 1 is a schematic diagram of a pixel framework of a column inversion display panel in the prior art.

The following reference to the accompanying drawings of the present disclosure introduces preferred embodiments of the present disclosure, proving that the present disclosure may be implemented, the embodiment of the invention may be a complete introduction to those skilled in the art of the present disclosure, so that its technical content is more clear and easy to understand. The present disclosure may be embodied by many different forms of embodiments of the present disclosure, the scope of protection of the present disclosure is not limited to the embodiments referred to herein. In addition, it should be understood that the specific embodiments described herein are only used to illustrate and explain the present application, but not to limit the present application. In this application, unless otherwise stated, the directional words used such as "upper" and "lower" generally refer to the upper and lower parts of the device in actual use or working state, specifically the direction of the drawing in the drawings; while "inside" and "outside" refer to the outline of the device.

At present, there are mainly two types of display panels that can use the "two-row scanning technology":

One type is a column inversion display panel as shown in FIG. 1, which adopts the driving mode of column inversion. In the column inversion framework, the polarity of adjacent data lines is opposite, and the data lines are connected to the pixels of the right columns. It has the advantages of low power consumption and high charging rate of the display panel. However, its disadvantage is the risk of longitudinal crosstalk.

Figure 2:
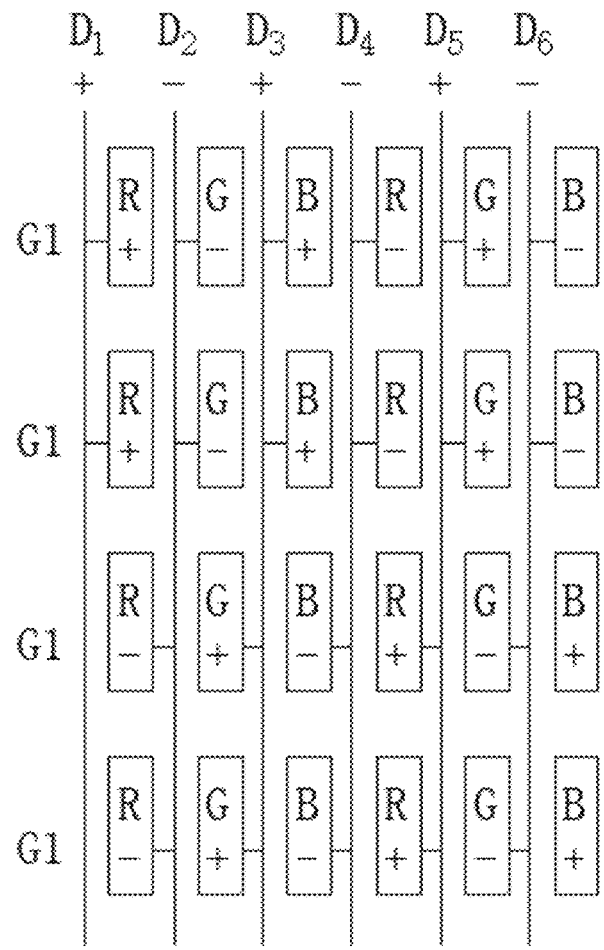
FIG. 2 is a schematic diagram of a pixel framework of a dot inversion display panel in the prior art.

The other type is the two-row dot inversion display panel as shown in FIG. 2, which adopts the driving mode of two-row dot inversion. In the two-row dot inversion framework, the polarity of adjacent data lines is opposite, and the sub-pixels in groups of 2 connected to the data line are alternately distributed on both sides of the data line. This framework can achieve the display effect of dot inversion with low crosstalk risk. However, when the solid color picture R/G/B (i.e., pure red R, pure green G, pure blue B) is displayed, in a column of sub-pixels of a certain color, the charging rate of two adjacent luminous sub-pixels connected to the same data line is different, resulting in alternating "heavy loaded pixels" and "light loaded pixels". The macro performance is that one row is bright and the other row is dark, that is, an abnormal display problem of horizontal bright and dark lines. The present disclosure proposes the following schemes based on the technical problems mentioned above.

Figure 3:
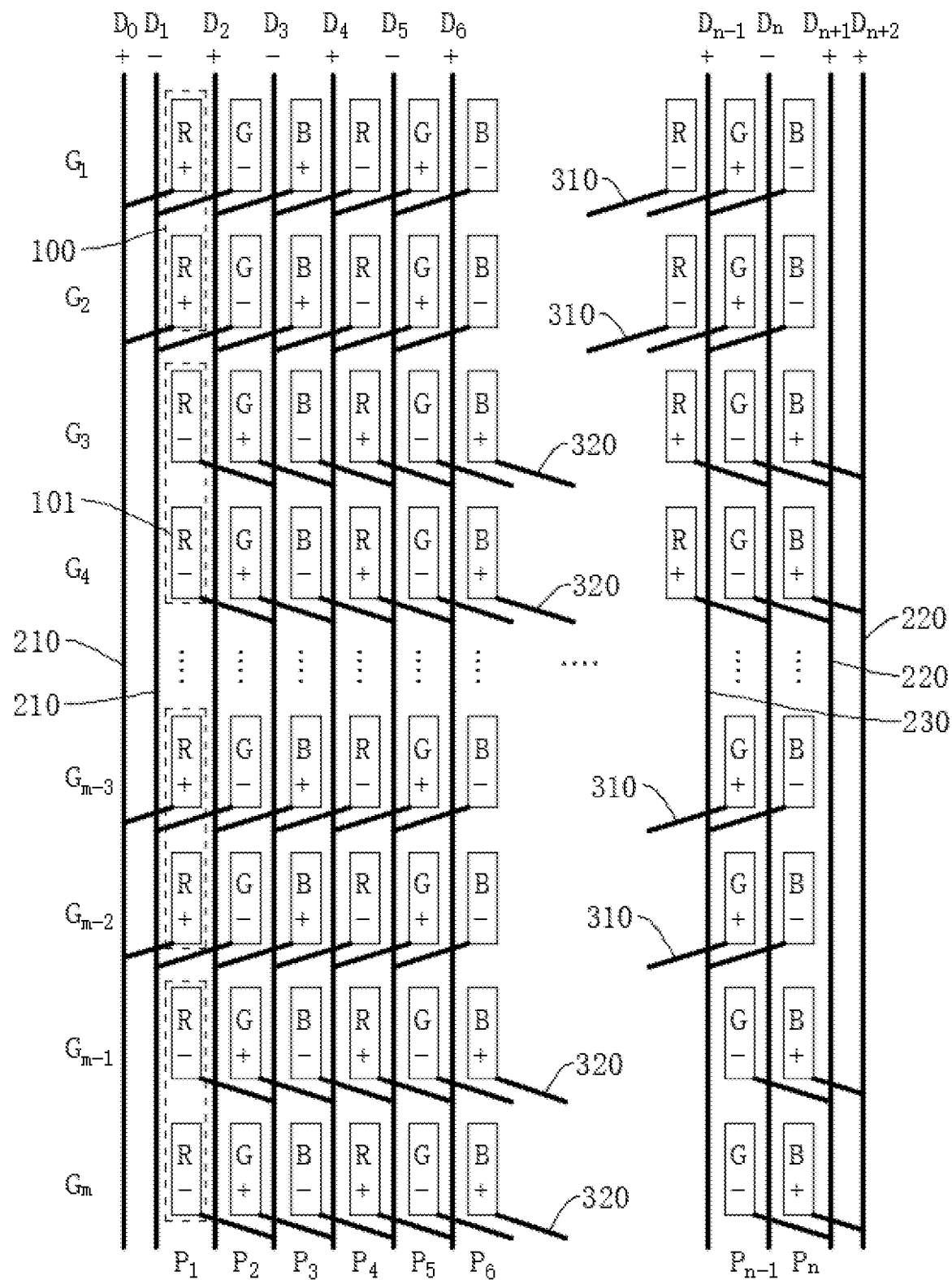
FIG. 3 is a schematic diagram of a pixel framework of a display panel according to one embodiment of the present disclosure.

Please refer to FIG. 3. An embodiment of the present disclosure is directed to a display panel, which comprises a pixel array and a plurality of data lines arranged in the pixel array. The pixel array may comprise a plurality of sub-pixel groups 100 arranged in array. The sub-pixel groups 100 of a same color are disposed in columns, and the sub-pixel groups of a same column are arranged along a first direction. Each of the sub-pixel groups 100 may comprise at least two adjacent sub-pixels 101 arranged along the first direction. The data lines may extend along the first direction and are arranged in the pixel array along a second direction. A polarity of adjacent data lines is opposite in the second direction. The first direction is perpendicular to the second direction. Each of the plurality of data lines is connected to some of the plurality of sub-pixel groups 100 alternately disposed on both sides of the data line along the first direction. In the second direction, at least one sub-pixel group 100 is arranged along the first direction between each data line and the sub-pixel groups 100 connected to the data line. At least one sub pixel group 100. A number of the data lines is greater than a number of the sub-pixel groups 100 arranged along the second direction. At least one data line is disposed between two adjacent sub-pixel groups 100 in the second direction.

Although reference is made herein to specific embodiments to describe the present disclosure, it should be understood that these embodiments are merely examples of the principles and applications of the present disclosure. It should therefore be understood that many modifications may be made to exemplary embodiments, and other arrangements may be designed, as long as they do not deviate from the spirit and scope of the present disclosure as defined by the appended claims. It should be understood that different dependent claims and features described herein may be combined in a manner different from those described in the original claims. It will also be appreciated that the features described in conjunction with a separate embodiment may be used in other embodiments.

The technical solutions of this application are described in conjunction with specific embodiments. It should be noted that the description order of the following embodiments does not limit the preferred order of the embodiments.

The pixel array comprises a red sub-pixel group (R), a green sub-pixel group (G), and a blue sub-pixel group (B). Each of the sub-pixel groups 100 may comprises at least two sub-pixels 101 of the same color to realize the "two-row scanning technology" of the display panel.

Multiple sub-pixel groups 100 or only one sub-pixel group 100 may be spaced between the sub-pixel groups 100 connected to the data line and the data line in the second direction. Preferably, in this embodiment, only one sub-pixel group 100 is spaced between the data line and the sub-pixel groups 100 connected to the data line.

The first direction may be a column direction of the pixel array, and the second direction may be a row direction of the pixel array.

Please refer to FIG. 3. In the display panel of this embodiment of the present disclosure, the number of the data lines may be greater than the number of the sub-pixel groups 100 arranged along the second direction, so that the sub-pixel groups 100 may be connected to the data line spaced at least one sub-pixel group 100 in the second direction.

In the second direction, at least one data line is disposed between two adjacent sub-pixel groups 100, so that a larger number of the data lines can be more evenly disposed in the column slots of the pixel array, and an interval disposed between the data line and the sub-pixel groups 100 connected to the data line is reduced to a certain extent, which is conducive to simplifying the wiring layout on the display panel.

Please refer to FIG. 3. The pixel array may comprise n columns of sub-pixels in the second direction, a number of columns of the data lines is n+3, and N is a positive integer. That is, the number of the data lines may be 3 more than a number of columns of the sub-pixels 101. Specifically, n columns of the sub-pixels can be respectively numbered as $P_1, P_2, P_3 \ldots P_N$, and n+3 columns of the data lines can be respectively numbered as $D_0, D_1, D_2 \ldots D_{n+2}$.

In this embodiment, xth column of the sub-pixels may be connected to (x−1)th column of the data lines or (x+2)th column of the data lines, $1 \leq x \leq n$, and x is a positive integer. That is, the first column of the sub-pixels $P_1$ may be connected to the 0th column of the data lines $D_0$ or the third column of the data lines $D_3$, the second column of the sub-pixels $P_2$ may be connected to the first column of the data lines $D_1$ or the fourth column of the data lines $D_4$, the third column of the sub-pixels $P_3$ may be connected to the second column of the data lines $D_2$ or the fifth column of the data lines $D_5$, and so on.

In the xth column of the sub-pixels, whether a specific sub-pixel 101 is connected to the (x−1)th column of the data lines or the (x+2)th column of the data lines depends on the position of the sub-pixel 101 located in the pixel array along the second direction, that is, the row ordinal number of the sub-pixel 101.

Please refer to FIG. 3. The pixel array may comprise m rows of the sub-pixels 101 in the first direction, and m is a positive integer greater than or equal to 4.

(4b−2)th row of the sub-pixels 101 and (4b−3)th row of the sub-pixels 101 are connected to the (x−1)th column of the data lines in the xth column of the sub-pixels, and b is a positive integer satisfying 4b−2≤m. Specifically, in the xth column of the sub-pixels 101, the first row of the sub-pixels 101 and the second row of the sub-pixels 101 may be connected to the (x−1)th column of the data lines, the fifth row of the sub-pixels 101 and the sixth row of the sub-pixels 101 may be connected to the (x−1)th column of the data lines, the ninth row of the sub-pixels 101 and the tenth row of the sub-pixels 101 may be connected to the (x−1)th column of the data lines, and so on.

Please refer to FIG. 3. Ath row of the sub-pixels 101 and (a−1)th of the sub-pixels 101 are connected to the (x+2)th column of the data lines in the xth column of the sub-pixels, and a is a multiple of 4 less than or equal to m. Specifically, in the xth column of the sub-pixels, the third row of the sub-pixels 101 and the fourth row of the sub-pixels 101 may be connected to the (x+2)th column of the data lines, the seventh row of the sub-pixels 101 and the eighth row of the sub-pixels 101 may be connected to the (x+2)th column of the data lines, and the eleventh row of the sub-pixels 101 and the twelfth row of the sub-pixels 101 may be connected to the (x+2)th column of the data lines.

To sum up, in a certain column of the sub-pixels $P_x$, the first row of the sub-pixels $P_{1x}$ and the second row of the sub-pixels $P_{2x}$ may be connected to the (x−1)th column of the data lines, the third row of the sub-pixels $P_{3x}$ and the fourth row of the sub-pixels $P_{4x}$ may be connected to the (x+2)th column of the data lines, the fifth row of the sub-pixels $P_{5x}$ and the sixth row of the sub-pixels $P_{6x}$ may be connected to the (x−1)th column of the data lines, the seventh row of the sub-pixels $P_{7x}$ and the eighth row of the sub-pixels $P_{8x}$ may be connected to the (x+2)th column of the data lines, and so on.

In order to make the figures concise and clear, $P_x$, $P_{1x}$, $P_{2x}$, $P_{3x}$ ... and other symbols are not actually marked in FIG. 3. However, in combination with the text description of this embodiment, each of the sub-pixels corresponding to the above symbols can be determined without any objection. Similarly, the following description shall also be deemed to fully disclose the technical solution.

In the first column of the sub pixels: the first and second rows of the sub-pixels $P_{11}$, $P_{21}$ may be connected to the data line $D_0$, the third and fourth rows of the sub-pixels $P_{31}$, $P_{41}$ may be connected to the data line $D_3$, the fifth and sixth rows of the sub-pixels $P_{51}$, $P_{61}$ may be connected to the data line $D_0$, the seventh and eighth rows of the sub-pixels $P_{71}$, $P_{81}$ may be connected to the data line $D_3$, and so on.

In the second column of the sub pixels: the first and second rows of the sub-pixels $P_{12}$, $P_{22}$ may be connected to the data line $D_1$, the third and fourth rows of the sub-pixels $P_{32}$, $P_{42}$ may be connected to the data line $D_4$, the fifth and sixth rows of the sub-pixels $P_{52}$, $P_{62}$ may be connected to the data line $D_1$, the seventh and eighth rows of the sub-pixels $P_{72}$, $P_{82}$ may be connected to the data line $D_4$, and so on.

In the third column of the sub pixels: the first and second rows of the sub-pixels $P_{13}$, $P_{23}$ may be connected to the data line $D_2$, the third and fourth rows of the sub-pixels $P_{33}$, $P_{43}$ may be connected to the data line $D_5$, the fifth and sixth rows of the sub-pixels $P_{53}$, $P_{63}$ may be connected to the data line $D_2$, the seventh and eighth rows of the sub-pixels $P_{73}$, $P_{83}$ may be connected to the data line $D_5$, and so on.

Among the fourth column of the sub-pixels to column n of the sub-pixels, the connection relationship between the sub-pixels 101 in each ath row nd the data lines can be derived from the relationship between the first column of the sub-pixels, the second column sub-pixels, the third column of the sub-pixels, and the data line. This embodiment will not be repeated here.

Please refer to FIG. 3. In the display panel of this embodiment of the present disclosure, the data lines comprise at least two first type of data lines 210 located at a first side of the pixel array and at least two second type of data lines 220 located at a second side of the pixel array in the second direction. The first type of data lines 210 and the second type of data lines 220 are located at an area outside the pixel array.

In this embodiment, in the second direction, the at least two first type of data lines 210 are respectively connected to the first column of the sub-pixels and the second column of the sub-pixels, and the at least two second type of data lines 220 are respectively connected to the last column of the sub-pixels and the second last column of the sub-pixels.

In this embodiment, part of the sub-pixels 101 in the first column of the sub-pixels $P_1$ are connected to the data line $D_0$, and part of the sub-pixels 101 in the second column of the sub-pixels $P_2$ are connected to the data line $D_1$. Therefore, the at least two first type of data lines 210 may comprise the data line $D_0$ and the data line $D_1$, that is, the data line $D_0$ and the data line $D_1$ may be located at the first side of the pixel array in the first direction.

In this embodiment, part of the sub-pixels 101 in the last column of the sub-pixels $P_n$ are connected to the data line $D_{n-2}$, and part of the sub-pixels 101 in the second last column of the sub-pixels $P_{n-1}$ are connected to the data line $D_{n-1}$. Therefore, the at least two second type of data lines 220 may comprise the data line $D_{n-2}$ and the data line $D_{n-1}$, that is, the data line $D_{n-1}$ and the data line $D_{n-2}$ may be located at the second side of the pixel array in the first direction.

Please refer to FIG. 3. In the display panel of this embodiment of the present disclosure, the data lines may also comprise a third type of data line 230 located in the pixel array. In this embodiment, the third type of data line 230 may be a data line other than the first type of data line 210 and the second type of data line 220. In combination with the above description, it can be seen that the third type of data line 230 may comprise data lines $D_2$, $D_3$, $D_4$ ... $D_{n-1}$, $D_n$. That is, the data lines $D_2$, $D_3$, $D_4$ ... $D_{n-1}$, $D_n$ are located in an interval disposed between two adjacent rows of the sub-pixels in the second direction in the pixel array.

In this embodiment, an interval disposed between the two first type of data lines 210 may be less than an interval disposed between two adjacent third type of data lines 230 in the second direction. That is, the interval disposed between the data line $D_0$ and the data line $D_1$ may be less than the interval disposed between any two adjacent data lines in the data lines $D_2$, $D_3$, $D_4$ ... $D_{n-1}$, $D_n$, so that the first type of data lines 210 located at the periphery of the pixel array are arranged more closely in the second direction to reduce the area occupied by the peripheral data lines, which is conducive to reducing the waste of panel size and narrowing the border width of the display device.

In this embodiment, similar to the first type of data lines 210, an interval disposed between the two second type of data lines 220 may be less than an interval disposed between the two adjacent third type of data lines 230 in the second direction. That is, the interval disposed between the data line $D_n$ and the data line $D_{n-1}$ may be less than the interval disposed between any two adjacent data lines in the data lines $D_2$, $D_3$, $D_4$ ... $D_{n-1}$, $D_n$, so that the second type of data lines 220 located at the periphery of the pixel array are arranged more closely in the second direction to further reduce the area occupied by the peripheral data lines, which is conducive to reducing the waste of panel size and narrowing the border width of the display device.

Please refer to FIG. 3, the display panel may also comprises a plurality of connection lines connected to the data lines and the sub-pixels 101. The connection lines comprise a first type of connection line 310 and a second type of connection line 320. The first type of connection line 310 and the second type of connection line 320 are alternately connected to the sub-pixel groups 100 located at different sides of the data lines in the first direction.

Specifically, take the data line $D_3$ as an example, the data line $D_3$ may be connected to the first sub-pixel group 100 in the fourth column of the sub-pixels through the first type of connection line 310 in the first direction. That is, the data line $D_3$ may be connected to the first row of the sub-pixels $P_{14}$ and the second row of the sub-pixels $P_{24}$ in the fourth column of the sub-pixels $P_4$ respectively through the two first type of connection lines 310. The data line $D_3$ may be connected to the second sub-pixel group 100 in the first column of the sub-pixels $P_1$ through the second type of connection line 320 in the first direction. That is, the data line $D_3$ may be connected to the third row of the sub-pixels $P_{31}$ and the fourth row of the sub-pixels $P_{41}$ in the first column of the sub-pixels $P_1$ respectively through the two second type of connection lines 320. The data line $D_3$ may be connected to the third sub-pixel group 100 in the fourth column of the sub-pixels $P_4$ through the first type connection line 310. That is, the data line $D_3$ may be connected to the fifth row of the sub-pixels $P_{54}$ and the sixth row of the sub-pixels $P_{64}$ in the fourth column of the sub-pixels $P_4$ respectively through the two first type of connection lines 310. The data line $D_3$ may be connected to the fourth sub-pixel group 100 in the first column of the sub-pixels $P_1$ through the second type of connection line 320. That is, the data line $D_3$ may be connected to the seventh row of the sub-pixels $P_{71}$ and the eighth row of the sub-pixels $P_{81}$ in the first column of the sub-pixels $P_1$ respectively through the two second type of connection lines 320, and so on.

In this embodiment, due to the data line $D_0$ and the data line $D_1$ are located at the first side of the pixel array, and data line $D_{n-1}$ and the data line $D_{n+2}$ are located at the second side of the pixel array, the data line $D_0$ and the data line $D_1$, the data line $D_{n-1}$ and the data line $D_{n-2}$ are only connected to the sub-pixel groups 100 on one side of the data lines. Specifically, the data line $D_0$ may be connected to only part of the sub-pixel groups 100 in the first column of the sub-pixels $P_1$ through the first type of connection line 310. The data line $D_1$ may be connected to only part of the sub-pixel groups 100 in the second column of the sub-pixels $P_2$ through the first type of connection line 310. The data line $D_{n-1}$ may be connected to only part of the sub-pixel groups 100 in the column n-1 of the sub-pixels $P_{n-1}$ through the second type of connection line 320. The data line $D_{n-1}$ may be connected to only part of the sub-pixel groups 100 in the column n of the sub-pixels $P_n$ through the second type of connection line 320.

Please refer to FIG. 3, multiple first type of connection lines 310 can be disposed in parallel with each other, and multiple second type of connection lines 320 can be disposed in parallel, so that the first type of data lines 210 and the second type of data lines 220 can be regularly distributed in the plane, thereby improving the routing regularity and reducing the routing short circuit and other abnormalities.

An extension direction of the first type of connection lines 310 and the second type of connection lines 320 may be different, and an included angle formed between the first type of connection lines 310 and the data lines is the same as an included angle formed between the second type connection lines 320 and the data lines, so as to make full use of the row gap in the pixel array to avoid or reduce as much as possible the overlap or intersection of the first type of connection lines 310 and the second type of connection lines 320 in the row gap of the pixel array, thereby reducing circuit abnormalities such as line short circuit.

An embodiment of the present disclosure is also directed to a display terminal, which may comprise a terminal body and a display panel described in the above embodiments, and the terminal body is integrated with the display panel. In this embodiment, the display terminal can be an intelligent display device such as a television, a computer, a mobile phone, etc.

By connecting the data line with the sub-pixel groups of the same color, the present disclosure can overcome the problem of poor charging uniformity of two adjacent luminous sub-pixels when displaying a solid color picture due to the sub-pixels of different colors connected to the same data line in the traditional two-row dot inversion framework. In addition, the sub-pixel groups connected to the same data line are alternately disposed on both sides of the data line of the present disclosure, and at least one sub-pixel group is spaced between the data line and the sub-pixel groups connected to it, so that the problem of longitudinal crosstalk existing in the traditional column inversion display panel can be overcome. Furthermore, the present disclosure applies the "two-row scanning technology" to realize the transformation of a dynamic picture of the display panel from 60 Hz to 120 Hz.

Although reference is made herein to specific embodiments to describe the present disclosure, it should be understood that these embodiments are merely examples of the principles and applications of the present disclosure. It should therefore be understood that many modifications may be made to exemplary embodiments, and other arrangements may be designed, as long as they do not deviate from the spirit and scope of the present disclosure as defined by the appended claims. It should be understood that different dependent claims and features described herein may be combined in a manner different from those described in the original claims. It will also be appreciated that the features described in conjunction with a separate embodiment may be used in other embodiments.

What is claimed is:

1. A display panel, comprising:
  a pixel array, comprising a plurality of sub-pixel groups arranged in the pixel array, wherein sub-pixel groups of a same color are disposed in columns, and sub-pixel groups of a same column are arranged along a first direction, and each of the sub-pixel groups comprises at least two adjacent sub-pixels arranged along the first direction; and
  a plurality of data lines, extending along the first direction and arranged in the pixel array along a second direction, wherein adjacent ones of the plurality of data lines in the second direction is configured to receive signals of opposite polarity, and the first direction is perpendicular to the second direction;
  wherein, each of the plurality of data lines is connected to some of the plurality of sub-pixel groups of the same color alternately disposed on both sides of the data line along the first direction; and
  at least one sub-pixel group is spaced between the sub-pixel groups connected to the data line and the data line in the second direction, and the plurality of sub-pixel groups arranged along the second direction are less in number than the plurality of data lines;
  wherein, at least one data line is disposed between two adjacent sub-pixel groups in the second direction.

2. The display panel as claimed in claim 1, wherein the pixel array comprises n columns of the sub-pixels in the second direction, a number of columns of the data lines is n+3, and n is a positive integer; wherein an xth column of the sub-pixels is connected to an (x−1)th column of the data lines or an (x+2)th column of the data lines, where $1 \leq x \leq n$, x is a positive integer.

3. The display panel as claimed in claim 2, wherein the pixel array comprises m rows of the sub-pixels in the first direction, and m is a positive integer greater than or equal to 4; wherein an ath row of the sub-pixels and an (a−1)th of the sub-pixels are connected to the (x+2)th column of the data lines in the xth column of the sub-pixels.

4. The display panel as claimed in claim 2, wherein the pixel array comprises m rows of the sub-pixels in the first direction, and m is a positive integer greater than or equal to 4; wherein an (4b−2)th row of the sub-pixels and an (4b−3)th row of the sub-pixels are connected to the (x−1)th column of the data lines in the xth column of the sub-pixels, and b is a positive integer satisfying 4b−2≤m.

5. The display panel as claimed in claim 2, wherein the data lines comprise at least two first type of data lines located at a first side of the pixel array and at least two second type of data lines located at a second side of the pixel array in the second direction; wherein in the second direction, the at least two first type of data lines are respectively connected to a first column of the sub-pixels and a second column of the sub-pixels, and the at least two second type of data lines are respectively connected to the last column of the sub-pixels and the second last column of the sub-pixels.

6. The display panel as claimed in claim 5, wherein the data lines further comprise at least two third type of data lines located in the pixel array; wherein an interval disposed between adjacent ones of the at least two first type of data lines is less than an interval disposed between adjacent ones of the at least two third type of data lines in the second direction.

7. The display panel as claimed in claim 6, wherein an interval disposed between adjacent ones of the at least two second type of data lines is less than an interval disposed between adjacent ones of the at least two third type of data lines in the second direction.

8. The display panel as claimed in claim 2, further comprising:
a plurality of connection lines connected to the data lines and the sub-pixels; wherein the connection lines comprise a first type of connection line and a second type of connection line, the first type of connection line and the second type of connection line are alternately connected to the sub-pixel groups disposed on both sides of the data line in the first direction.

9. The display panel as claimed in claim 8, wherein a plurality of first type of connection lines are arranged in parallel with each other, and a plurality of second type of connection lines are arranged in parallel.

10. The display panel as claimed in claim 9, wherein an extension direction of the first type of connection lines and an extension direction of the second type of connection lines are different, and an included angle formed between the first type of connection lines and the data lines is the same as an included angle formed between the second type of connections lines and the data lines.

11. A display panel, comprising:
a pixel array, comprising a plurality of sub-pixel groups arranged in the pixel array, wherein sub-pixel groups of a same color are disposed in columns, and sub-pixel groups of a same column are arranged along a first direction, and each of the sub-pixel groups comprises at least two adjacent sub-pixels arranged along the first direction; and
a plurality of data lines, extending along the first direction and arranged in the pixel array along a second direction, wherein adjacent ones of the plurality of data lines in the second direction is configured to receive signals of opposite polarity, and the first direction is perpendicular to the second direction;
wherein, each of the plurality of data lines is connected to some of the plurality of sub-pixel groups of the same color alternately disposed on both sides of the data line in the sub-pixel groups of the same color connected to the same data line along the first direction; and
at least one sub-pixel group is spaced between the sub-pixel groups connected to the data line and the data line in the second direction;
wherein, at least one data line is disposed between two adjacent sub-pixel groups in the second direction.

12. The display panel as claimed in claim 11, wherein the pixel array comprises n columns of the sub-pixels in the second direction, a number of columns of the data lines is n+3, and n is a positive integer; wherein an xth column of the sub-pixels is connected to an (x−1)th column of the data lines or an (x+2)th column of the data lines, where 1≤x≤n, and x is a positive integer.

13. The display panel as claimed in claim 12, wherein the data lines comprise at least two first type of data lines located at a first side of the pixel array and at least two second type of data lines located at a second side of the pixel array in the second direction; wherein in the second direction, the at least two first type of data lines are respectively connected to a first column of the sub-pixels and a second column of the sub-pixels, and the at least two second type of data lines are respectively connected to the last column of the sub-pixels and the second last column of the sub-pixels.

14. The display panel as claimed in claim 13, wherein the data lines further comprise at least two third type of data lines located in the pixel array; wherein an interval disposed between adjacent ones of the at least two first type of data lines is less than an interval disposed between adjacent ones of the at least two third type of data lines in the second direction.

15. The display panel as claimed in claim 14, wherein an interval disposed between adjacent ones of the at least two second type of data lines is less than an interval disposed between adjacent ones of the at least two third type of data lines in the second direction.

16. The display panel as claimed in claim 12, wherein the pixel array comprises m rows of the sub-pixels in the first direction, and m is a positive integer greater than or equal to 4; wherein an ath row of the sub-pixels and an (a−1)th of the sub-pixels are connected to the (x+2)th column of the data lines in the xth column of the sub-pixels.

17. The display panel as claimed in claim 12, wherein the pixel array comprises m rows of the sub-pixels in the first direction, and m is a positive integer greater than or equal to 4; wherein an (4b−2)th row of the sub-pixels and an (4b−3)th row of the sub-pixels are connected to the (x−1)th column of the data lines in the xth column of the sub-pixels, and b is a positive integer satisfying 4b−2≤m.

18. The display panel as claimed in claim 12, further comprising:
a plurality of connection lines connected to the data lines and the sub-pixels; wherein the connection lines comprise a first type of connection line and a second type of connection line, the first type of connection line and the second type of connection line are alternately connected to the sub-pixel groups disposed on both sides of the data line in the first direction.

19. The display panel as claimed in claim 18, wherein a plurality of first type of connection lines are arranged in parallel with each other, and a plurality of second type of connection lines are arranged in parallel, and wherein an extension direction of the first type of connection lines and an extension direction of the second type of connection lines are different, and an included angle formed between the first type of connection lines and the data lines is the same as an included angle formed between the second type of connections lines and the data lines.

20. A display terminal, comprising a terminal body and a display panel as claimed in claim 11, wherein the terminal body is integrated with the display panel.

* * * * *